US005895997A

United States Patent [19]

Puskas et al.

[11] Patent Number: 5,895,997

[45] Date of Patent: Apr. 20, 1999

[54] FREQUENCY MODULATED ULTRASONIC GENERATOR

[75] Inventors: Peter J. Puskas; David Arata, both of Freeport, Ill.

[73] Assignee: Ultrasonic Power Corporation, Freeport, Ill.

[21] Appl. No.: 08/840,544

[22] Filed: Apr. 22, 1997

[51] Int. Cl.[6] .......... H01L 41/08

[52] U.S. Cl. .......... 310/316; 134/1; 134/184

[58] Field of Search .......... 310/316, 317; 318/116; 134/1, 18, 34, 184

[56] References Cited

U.S. PATENT DOCUMENTS

| | | | |
|---|---|---|---|
| 4,319,155 | 3/1982 | Nakai et al. | 310/316 |
| 4,736,130 | 4/1988 | Puskas | 310/316 |
| 5,109,174 | 4/1992 | Shewell | 310/317 |
| 5,216,338 | 6/1993 | Wilson | 318/116 |
| 5,218,980 | 6/1993 | Evans | 310/317 X |
| 5,276,376 | 1/1994 | Puskas | 310/317 |
| 5,462,604 | 10/1995 | Shibano et al. | 310/316 X |
| 5,496,411 | 3/1996 | Candy | 310/316 X |
| 5,534,741 | 7/1996 | Smith | 310/317 |

*Primary Examiner*—Mark O. Budd
*Attorney, Agent, or Firm*—Leydig, Voit & Mayer, Ltd.

[57] ABSTRACT

A generator for driving an ultrasonic transducer for use in ultrasonic cleaning. The generator is capable of maintaining substantially constant real output to a load while the output frequency of the generator is square wave frequency modulated about a wide bandwidth. Thus, the generator is capable of maintaining substantially constant real output to the load even if the output frequency is modulated substantially away from the load's resonant frequency. The square wave modulation of the output frequency causes improved cavitation of semi-aqueous cleaning solutions used in the load, and thus improves the cleaning action of the ultrasonic transducer.

19 Claims, 4 Drawing Sheets

FREQUENCY MODULATED ULTRASONIC GENERATOR

FIELD OF THE INVENTION

This invention relates to ultrasonic cleaning, and more particularly to an improved generator for driving ultrasonic transducers attached to cleaning tanks containing a volume of aqueous or semi-aqueous cleaning solution.

BACKGROUND OF THE INVENTION

In ultrasonic cleaning, a transducer, usually piezoelectric but sometimes magnetostrictive, is secured to or immersed in a cleaning tank to controllably impart ultrasonic vibration to the tank. The tank is filled with a cleaning liquid and parts are immersed into the liquid to be cleaned by ultrasonic agitation and cavitation. The ultrasonic energy itself can dislodge contaminants. Under certain conditions the ultrasonic energy also creates cavitation bubbles within the liquid where the sound pressure exceeds the liquid vapor pressure. When the cavitation bubbles collapse, the interaction between the ultrasonically agitated liquid and the contaminants on the parts immersed in the liquid causes the contaminants to be dislodged.

Various circuits have been configured for driving ultrasonic transducers and have provided a variety of features. Parameters which are available for adjustment or control are the ultrasonic frequency, the power level, amplitude or frequency modulation, and duty cycle control of power bursts, among others.

In ultrasonic cleaning, it is known that the output circuit, which usually includes a driver, the ultrasonic transducer, and the load have a resonant frequency. The load, of course, includes the cleaning tank, the liquid in the tank, and the parts immersed in the liquid. Quite clearly, the mass and shape of the parts, the temperature of the liquid, and other factors all influence the resonant frequency of the output circuit.

It is known that when the ultrasonic transducer is driven at the resonant frequency of the load, the system is capable of delivering maximum power to the load. Cavitation of the cleaning liquid can be enhanced by modulating the driving frequency, which implies moving away from resonance. Because the phase angle changes as the generator is modulated away from the resonant frequency, this dictates that even if the center frequency of the generator is tuned to resonance, as the output frequency is modulated, the real power delivered to the output is reduced. In generators without power control circuitry, the output power will thus fluctuate along with the output frequency as the output frequency is modulated.

Ultrasonic generators with power control capabilities are known in the art. For example, U.S. Pat. No. 5,276,376 to Puskas teaches a generator with power control circuitry capable of maintaining substantially constant power as the phase angle changes. To maintain constant power to the load, however, these systems sought to limit the maximum change in phase angle by limiting the modulation frequency bandwidth to substantially near resonant frequency, e.g., within ±1 kHz of resonant frequency. In systems of this type, therefore, a resonant follower automatically tuned the output frequency to resonance, and the modulation range was limited, so that the automatic power control worked within a limited band.

High efficiency is desirable in an ultrasonic generator, not only because high efficiency is generally considered to be more favorable than low efficiency, but also because it allows the components to be sized to match the designed task. Thus, if one were to produce a generator with a 500 watt output, and efficiency could be maintained within say 20%, then no part of the circuit would need to be designed to handle much more than about 600 watts. However, if the phase angle swings are such that the efficiency might vary by as much 2 to 1 or more, and it is desired to have 500 watts out at the worst case conditions, then it might be necessary to have input circuitry capable of handling 1000 watts or more. This extra capacity needed at the input in order to accommodate poor power factors at the output can be considered "head room". Large head room would not be necessary if the phase angle changes were small, but becomes more necessary in order to maintain the output power level as the phase angle changes become larger. Typically it is more straightforward to configure a generator which operates substantially near resonant frequency with perhaps a limited modulation bandwidth, than to configure a generator which might or might not operate at resonance, or may swing through resonance at unpredictable points, and to provide sufficient head room to maintain approximately consistent output power under these possible operating conditions.

In operation a further disadvantage of present ultrasonic generators is that they are incapable of adequately cavitating semi-aqueous cleaning solutions to obtain optimal cleaning results.

SUMMARY OF THE INVENTION

In view of the foregoing, it is a general aim of the present invention to provide an ultrasonic generator which can maintain substantially constant power while modulating the driving frequency substantially off-resonance from the load's resonant frequency.

It is another object of the invention to maintain substantially constant power to the load without the need for resonance follower circuitry. Thus, it is a related object of the invention that maintaining constant power to the load not be dependent on ensuring that the generator is driven at resonant load frequency.

It is yet another object of the invention to provide a high efficiency raw DC power source for providing power to the load and to accomplish power control between the raw power source and the load. Thus, it is a resultant object to separate the power source from the power control circuitry in the generator.

It is a feature of the invention that the power control circuitry utilizes a pulse width modulator interposed between a raw DC source and the load. The pulse width modulator outputs a drive signal having variable duty cycle with the duty cycle being adjusted to control output power.

In connection with cavitation, particularly in non-aqueous cleaning solutions, we have found, and it is a resulting object of the invention, to utilize square wave modulation in order to increase cavitation in such solutions to an effective level. It is a related object to thus switch output frequency very rapidly in order to achieve square wave modulation, while at the same time maintaining a substantially constant output power to the load during thus rapid frequency switching.

These and other objects and features are achieved according to the present invention by providing an ultrasonic generator which has an output circuit including an ultrasonic transducer and a coupled load configured in the following way. An output bridge is interposed between a DC voltage source and the ultrasonic transducer for supplying power at a controllable level from the DC voltage source to the ultrasonic transducer. The pulse width modulator generates a drive signal having a settable frequency and a variable duty cycle. The drive signal is coupled to the output bridge and causes the output bridge to drive the output circuit at the set frequency and to supply power to the transducer at a set power load. A modulation oscillator (e.g. a VCO) has a square wave output, and is coupled to the pulse width modulator to square wave modulate the drive signal frequency. The modulation is wideband, and has a bandwidth which is greater than ±1 kHz and preferably about ±2 kHz, to cause the drive signal frequency to switch rapidly between the frequencies at the modulation limits. A user-selectable power level control is coupled to the pulse width modulator and generates a control signal which sets the power to be delivered to the output circuit. A wattmeter circuit is coupled to the output circuit and generates a measuring signal indicative of the actual power delivered to the output circuit. The measuring signal and the control signal are used by the pulse width modulator to vary the duty cycle of the drive signal as the drive signal frequency is modulated. Typically the square wave modulation switches the output frequency through resonant and off-resonant conditions, and the duty cycle control maintains a substantially constant real power output to the output circuit.

Other objects and advantages will become apparent from the following detailed description when taken in conjunction with the drawings, in which:

DETAILED DESCRIPTION OF THE PREFERRED EMBODIMENT

While the invention will be described in connection with a preferred embodiment, there is no intent to limit it to that embodiment. On the contrary, the intent is to cover all alternatives, modifications, and equivalents included within the spirit and scope of the invention as defined by the appended claims.

Figure 1:
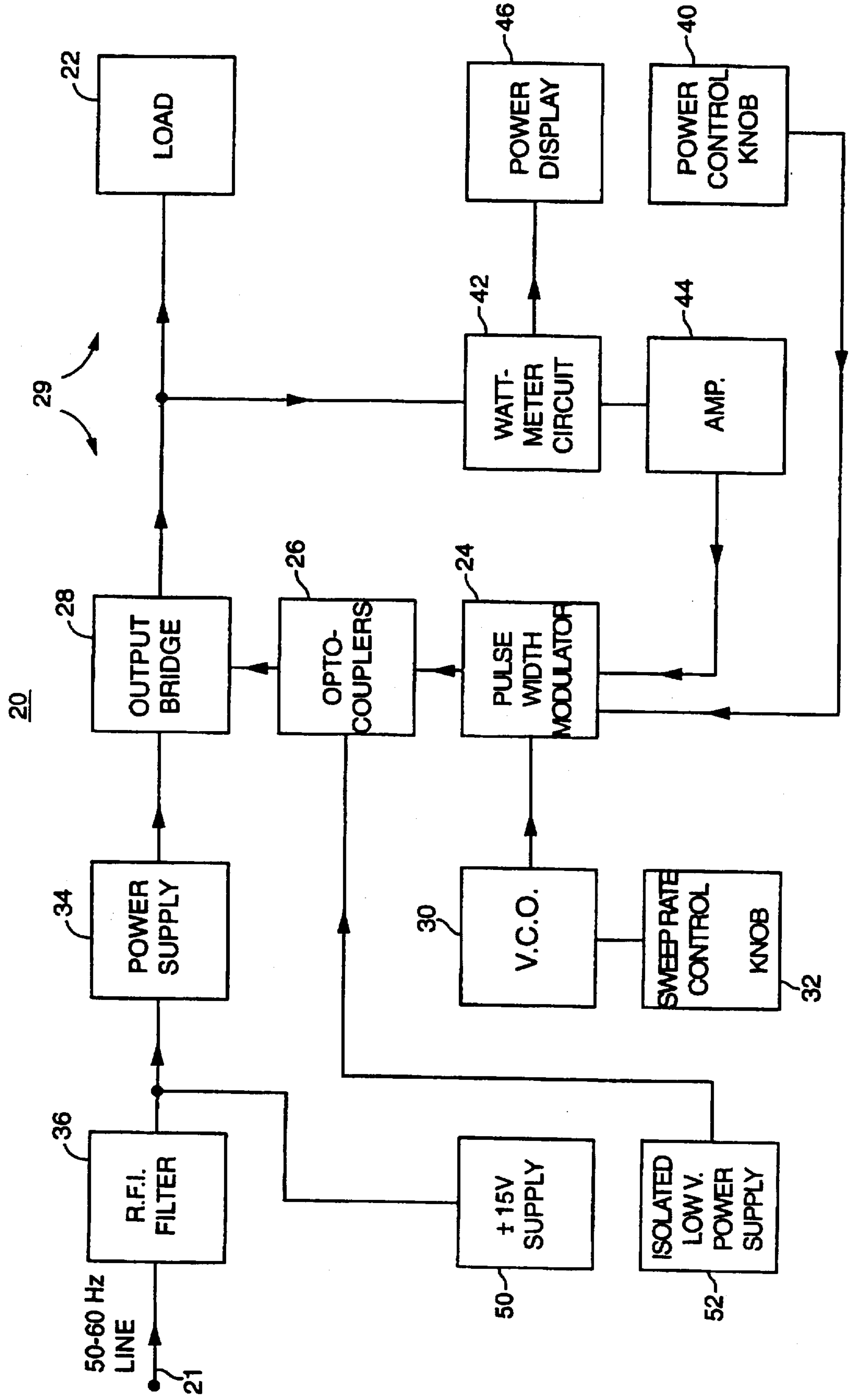
FIG. 1 is a block diagram of an ultrasonic generator exemplifying the present invention.

Turning to the drawings, FIG. 1 shows an ultrasonic generator 20 according to the invention powered from an AC line 21 and adapted to drive a load 22 which includes an ultrasonic transducer and the mechanical system coupled to the transducer. The load 22 has a resonant frequency which depends on the volume of cleaning liquid, shape of object to be cleaned, temperature, etc. The output frequency of the generator in the illustrated example is established in the pulse width modulator block 24. This is preferably a commercially available integrated circuit which generate an output signal at a settable frequency and having a control input to vary the duty cycle. This output signal is coupled as a drive signal to the output bridge 28 via the optocouplers 26. The output bridge 28 and load 22 are hereinafter sometimes collectively referred to as the output circuit 29. The output bridge in the preferred embodiment is comprised of four field effect transistors (FETS) in an "H" bridge configuration.

The drive signal generated by the pulse width modulator is frequency modulated, in the example the modulation being established by the voltage controlled oscillator (VCC) 30. The VCO is also preferably a commercially available integrated circuit which is used herein to output a square wave signal for square wave modulating the drive signal. The modulation is preferably wideband, defined herein as having a bandwidth greater than ±1 kHz. The modulation rate is user-selectable via the sweep rate control knob 32.

Figure 3:
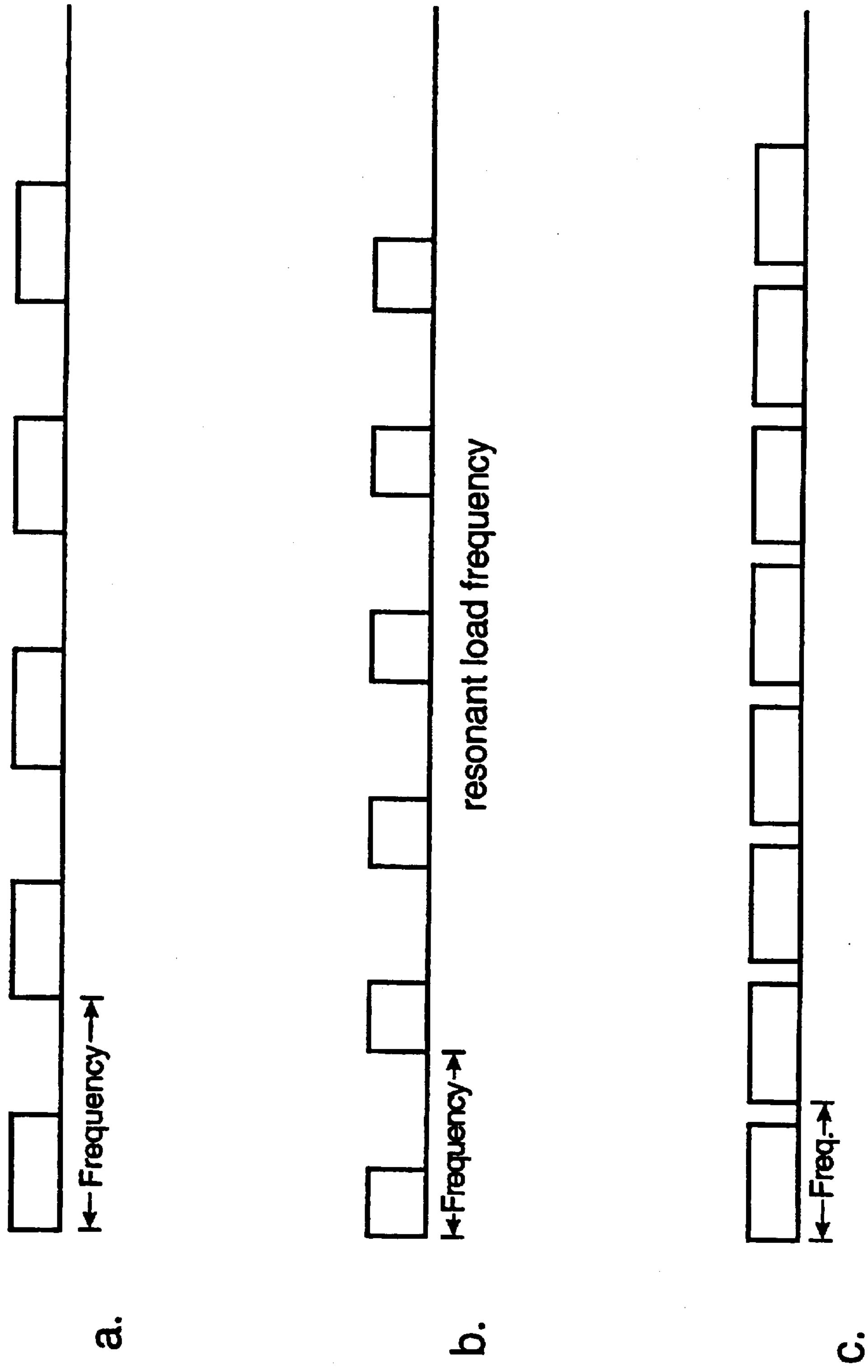

The output bridge 28 is interposed between the DC voltage source 34 and the load 22 and controls the amount of power delivered to the load as directed by the pulse width modulator 24. The DC voltage source 34 is a full wave diode bridge rectifier that rectifies the AC voltage from the line 21. As will be discussed in more detail herein, the power delivered by the output bridge 28 to the load 22 is dependent on the duty cycle and frequency of the drive signal generated by the pulse width modulator 24. As the frequency of the drive signal is modulated through a range of resonant, off-resonant or partly resonant load conditions the output phase angle (i.e. the angle between the output voltage and current vectors) changes, and real power in the load will correspondingly change with phase angle, (e.g. by a factor of 2 or more). If constant output power is required, the DC voltage source 34 will need to provide more volt amps to the transducer to maintain substantially constant real power at the load. To deliver more power from the voltage source 34 to the load 22 through the output bridge 28, the duty cycle of the drive signal is increased. In this manner, more current is delivered from the voltage source 34 through the output bridge 28 to the load 22. Conversely, as the drive signal is modulated towards resonant load frequency (i.e. as the phase angle decreases), the power supply 34 will need to provide less power to the transducer to maintain substantially constant power at the load and, therefore, the duty cycle of the drive signal is decreased. FIGS. 3*a*–3*c* illustrate this behavior. FIG. 3*b* represents the duty cycle of the output as the drive signal frequency is at resonant load frequency. It can be seen from FIGS. 3*a*, 3*c* that as the drive signal frequency is modulated to above or below resonant load frequency the duty cycle of the pulse is increased to compensate for the decrease in the system ability to deliver power to the load.

It can be appreciated that the generator according to the invention separates the power source (i.e., the DC voltage source 34) from the power control circuitry (i.e., the pulse width modulator). As a result, the system derives several advantages. By removing the power control circuitry from the power supply, the system is able to use a raw DC power source with a power factor of approximately one. In the past, when the DC power source was controlled as a mechanism for controlling output power, the reactive component in the power supply created a supply with poor phase angle. While it was thus possible to modulate the input power to maintain a substantially constant power within certain defined limits, the poor power factor in the load prevented the economical achievement of a power supply with very much head room. As described above, this resulted in the operation of the generator at resonance, and modulation within a comparatively narrow band near resonance.

Turning briefly to the issue of head room, the problem will be illustrated with a brief example. Let it be assumed that the load circuit, has at or near resonance, a power factor which is on the order of 0.3. This is not a high power factor, but as will be appreciated from the circuit diagrams of FIGS. 2*a* and 2*b*, the load in the illustrated system is fairly highly capacitive. When the system swings substantially off resonance, the power factor may be decreased by a factor of 2 or more, down to about 0.15 or even less. In order to generate 500 watts in the output circuit at resonance, in some cases it will be necessary to have an output voltage of about 500 volts and output current of about 3.5 amps. However, when the power factor reduces to about 0.15 the volt amp requirement will be about twice that of the resonant condition. Considering the power factor of the input bridge is about 1, it will be necessary to couple about twice the number of volt amps through the input circuitry to produce 500 watts in the off-resonant condition, as would be necessary in the resonant condition. It is a special requirement of the power generator of the present invention that adequate head room is provided (i.e. adequate volt amp capability through the input stages) to allow the system to operate at unpredictable frequencies (with respect to resonance), to rapidly switch between frequencies under conditions of square wave modulation, yet to maintain constant real power output under those dynamic conditions.

Returning to the description of FIG. 1, by utilizing a power supply 34 which is simply a raw power supply, without phase regulation or the like, where such supply has a power factor of about 1, it is reasonable within the economic and physical constraints of the system to configure a system with sufficient head room. Utilization of a raw or unswitched power supply, however, requires the control of power in a subsequent part of the system. In the present invention, the raw power supply is used in combination with the duty cycle control of the output stage. As a further feature, because of the improved power factor over systems that combine the power source and the power control circuitry, the generator is capable of providing maximum power to the load from a 120 V line while maintaining the current within a safe limit of approximately 5–6 A. In this manner, the system does not place exorbitant current demands on the line and can safely be operated from an ordinary 120 V, 60 Hz AC line. Of course, the invention can also safely be used from lines commonly used in other parts of the world (e.g., 100 V–120 V at 50–60 Hz, or 230 V at 50 Hz).

In practicing another important aspect of the invention, the system is adapted to allow user setting of a desired power level, to monitor the actual output power delivered to the load, and to maintain that output power at a substantially constant level while the drive signal frequency is modulated through resonant and off-resonant load frequencies. Thus, a power control knob 40 is provided which allows the user to select the desired output power level. The power control knob 40 produces a control signal which is compared by the pulse width modulator 24 with the actual power delivered to the load to establish the duty cycle of the drive signal generated by the pulse width modulator 24. The actual power delivered to the load is measured by the wattmeter circuit 42. The wattmeter circuit 42 is connected in the output circuit and responds to voltage, current and phase angle in the load 22 to indicate the actual power delivered to the load. A signal having a magnitude related to the actual delivered power is coupled by the wattmeter circuit 42 to the amplifier 44 and thence to the pulse width modulator 24. In this manner, it can be appreciated that the pulse width modulator is capable of calculating the difference between the desired power level and the actual power level, and varying the duty cycle of the drive signal to appropriately adjust the power delivered to the load 22. If desired, a display 46 is coupled to the wattmeter circuit 42 for providing an indication of the actual power delivered to the load.

It should be noted that while the generator does not maintain the power output at exactly the user-selected output level at all times, the variations in actual output power are such that the average actual output power is substantially constant at the desired output level. In one example, if the user-selected output level is 500 W, the actual output may vary between 490 W and 510 W as the drive signal frequency is modulated between its set limits (depending on the instrument used to measure power).

It has been proposed in ultrasonic cleaning generators in the past to utilize various forms of frequency modulation which can include sine wave modulation, triangle wave modulation, and the like. The present inventors have found that in using semi-aqueous solutions, it is very important to utilize square wave modulation, and highly desirable to provide square wave modulation in combination with a substantially constant power output. On the surface, that might sound simply like another form of modulation, readily selectable from the various types available. However, the practical implications make it clear that it is not.

If sine wave or triangle wave modulation is used about a center resonant frequency, it will be seen that a conventional ultrasonic cleaning generator will have a frequency which is swept in a fairly continuous manner about a resonant center frequency at a predetermined rate. The phase angle at resonance is maximum, then varies (either lineraly or along a sine wave path) as the modulation sweeps off-resonance, reaches the modulation limit, then reverses, back through resonance, and to the other limit, etc. If the phase angle swings are restricted to a limited band, a power control circuit can keep up with the changing phase angle to maintain fairly constant power output. However, it has been found that using semi-aqueous solutions, sine or triangle wave modulation does not produce sufficient cavitation, and the system is less effective at cleaning parts. Thus, we have found that square wave modulation is the much preferred form of modulation, but itself introduces problems. Square wave modulation implies operation at two frequencies, with rapid switching between the frequencies, so that even the center frequency is not utilized, except when switching between the modulation limits. Assume, for example, that the system is set for an output frequency of 40 kHz. Assume also that the modulation bandwidth is set for ±2 kHz, and the modulation rate at 100 Hz. That implies that the system switches rapidly between 38 and 42 kHz at a 100 Hz rate. Operation will be at the set frequency of 40 kHz only when it is rapidly switching from 38 to 42 or returning from 42 to 38. Significantly, it is not readily possible to assure that the center frequency or one of the modulation limits is a resonant frequency. Thus, the system will be set up, the operating frequency and modulation limits and rates will be set, and operation will begin. One of the limits may be much nearer resonance than the other, and the system will switch between the two limits, usually in less than a cycle of the 40 kHz output frequency. This very rapid switching between the output frequencies will require also a very rapid switching in duty cycle in order to maintain the constant output power at these two settable levels. Because the relationship of the operating frequencies with respect to resonance are substantially unknown to the circuit designer, it will be necessary to have input circuitry with sufficient head room (as described above) to operate in conjunction with the elements described here in order to provide a system which has relatively high but constant output power under these conditions.

A more complete understanding of the generator according to the invention can be obtained by way of an example. Suppose the generator is to be used for driving a load containing semi-aqueous cleaning solution whose resonant frequency is about 40 kHz. The pulse width modulator 24 is set to produce a drive signal with a frequency of 40 kHz. It must be noted, however, that the system can be adapted to drive a load of any resonant frequency, e.g., load with resonant frequencies of anywhere from 25 kHz to 120 kHz. The drive signal controls conduction in the output bridge 28 to cause the output bridge to supply power from the voltage source 34 to the load 22 proportional to the duty cycle of the drive signal. The duty cycle of the drive signal is initially selected by the pulse width modulator to supply the user-selected power level to the load. After the generator commences operation, the voltage controlled oscillator 30 produces a square wave signal which square wave modulates the frequency of the drive signal within a bandwidth of greater than ±1 kHz. In one example, optimal cavitation of the semi-aqueous cleaning solution is experimentally determined to be achieved by square wave modulating the drive signal frequency ±2 kHz at a modulation rate of about 1 kHz. If an aqueous cleaning solution is used, optimal cavitation might be obtained by sweeping the frequency at a rate of about 300 Hz to 400 Hz.

As the drive signal frequency is modulated to an off-resonant load frequency, the efficiency of the generator reduces. Conversely, as the drive signal frequency is modulated toward a resonant load frequency, the efficiency of the generator improves. The wattmeter circuit 42 measures the actual power delivered to the load and produces a measuring signal indicative of this actual power. The pulse width modulator 24 compares this measuring signal to the power level control signal and varies the duty cycle of the drive signal to maintain substantially constant power to the load. For example, as the system sweeps to an off-resonant frequency, the power delivered to the load decreases. The pulse width modulator thus increases the duty cycle of the drive signal to increase the amount of power delivered from the DC voltage source 34 to the load 22 through the output bridge 28. Conversely, when the system sweeps to a resonant frequency, the power to the load increases. The pulse width modulator thus decreases the duty cycle of the drive signal to decrease the power delivered from the DC voltage source 34 to the load 22 through the output bridge 28. Because the power factor of the DC voltage supply 34 is approximately one, the generator is capable of responding to the power demands at the load rapidly without at any time unduly increasing the current through the system.

It is worth noting that the AC line input 21, in the preferred embodiment of the invention, is coupled to the remainder of the system without the use of an isolation transformer. Elimination of the isolation transformer increases the efficiency of the system which can be important in certain ultrasonic generators. In the illustrated embodiment, the only element interposed between the AC line input 21 and the full wave bridge rectifier 34 is an RFI filter 36 which prevents transients generated in the ultrasonic generator from being coupled back to the AC line.

Further, the DC power supply 50 is also driven directly from the line, and as is more conventional, will include a stepdown transformer for reducing the level of the AC voltage to a level compatible with the necessary DC supplies; in a practical embodiment, positive and negative 15 volts and positive 5 volt supplies. It is preferred, however, that the voltage supply for the optocouplers 26 be an independent isolated low voltage power supply 52 to keep the gate circuits of the FETs isolated a their respective levels.

Figure 2A:
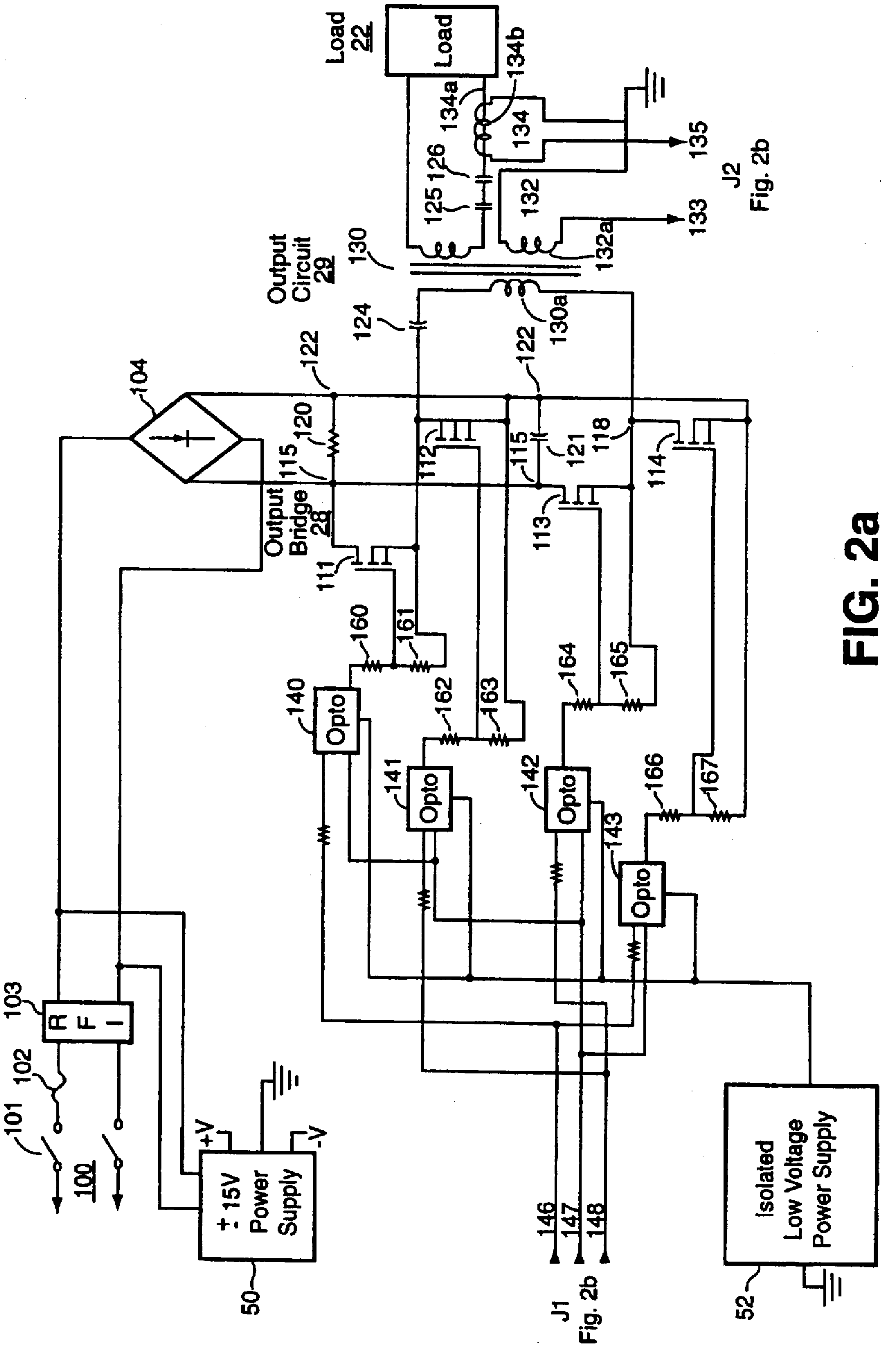
FIGS. 2*a*–2*b* are more detailed circuit diagrams of the generator of FIG. 1, and FIGS. 3(*a*–*c*) are timing diagrams depicting the change in the duty cycle of the drive signal as a function of drive signal frequency.
Figure 2B:
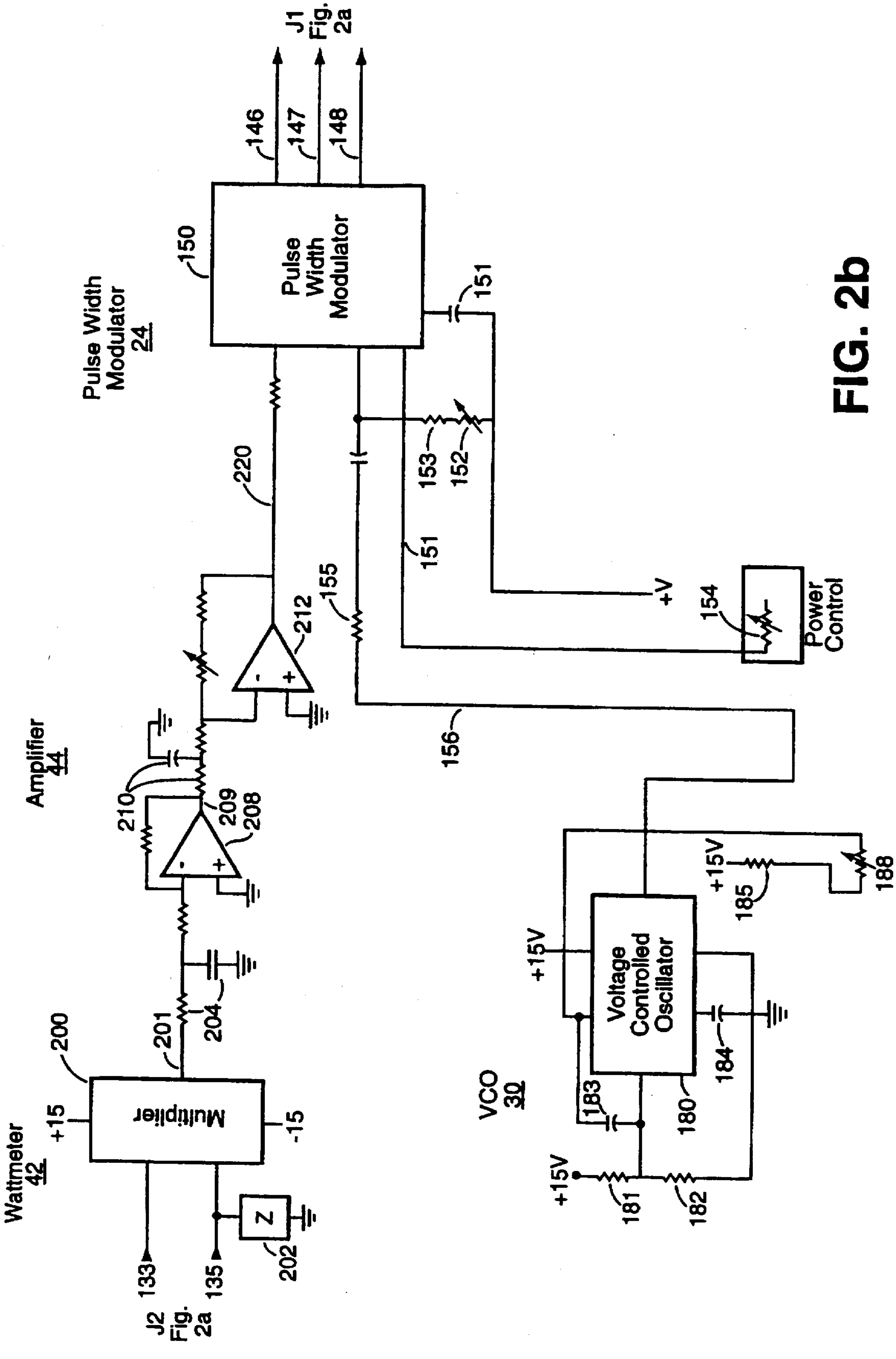

Turning now to FIGS. 2a–2b, there is shown a circuit diagram of a preferred embodiment of the invention having the structure and functionality of the system described in connection with FIG. 1. The circuit diagram is simplified to a certain extent by eliminating certain connections and components which will be utilized in the actual circuit, but whose presence in the patent drawings would only serve to distract from an understanding of the invention. Thus, for example, the exact interconnection of the optocouplers to the isolated low voltage power supply are not depicted so as to focus on the functionality of the isolated power supply providing the power for the optocouplers to drive the output bridge rather than the structure of how the optocouplers are coupled to the power source. It will be appreciated that one skilled in the art will thus be appraised of the important structural and functional features of the invention, and in implementing the invention with particular circuit components will be able to include the additional peripheral elements.

Turning to FIG. 2a, the system utilizes a single phase AC supply 100, preferably 120 volts, 60 Hz coupled through an on-off switch 101, a conventional fuse 102, and an RFI filter 103 directly to a full wave diode bridge rectifier 104. Of course, the system is adaptable to be utilized with any AC supply commonly used in the world (e.g., 100–120 V at 50–60 Hz, or 230 V at 50 Hz). It will be appreciated that no isolation transformer is used in the input supply, and thus the inefficiencies normally associated with passing reasonably large amounts of power through an input transformer are avoided.

The full wave bridge rectifier 104 is coupled to the output bridge 28. The output bridge 28, as illustrated in FIG. 2a, includes four field effect transistors (FETS) 111, 112, 113, and 114 connected in an "H" bridge configuration between the full wave rectifier 104 and the load 22. The drains of FETs 111, 113 are connected to the positive side of the rectifier 104 at node 115. The source of FET 111 is connected to the drain of FET 112 at node 116 while the source of FET 113 is connected to the drain of FET 114 at node 118. As further illustrated in FIG. 2a, the source of FETs 112, 114 are connected to the negative side of the rectifier 104 at node 122. The capacitor 121 serves to filter noise across the output bridge 28 and is discharged across the resistor 120.

The FETs 111–114 of the output bridge 28 are coupled to the drive signal generated by the pulse width modulator 28 through the optocoupler 140–143. By means described in more detail below, the FETs 111–114 are alternately switched on and off by the optocouplers 140–143 at the drive signal frequency for a period equivalent to the duty cycle of the drive signal. The FETs are configured in two pairs, with FETs 111, 113 forming one series pair and FETs 112, 114 forming another series pair. The FETs are switched on and off such that when FETs 111, 114 are switched on, FETs 112, 113 are switched off and vice versa.

The gates of FETs 111–114 are provided with drive voltage from optocouplers 140–143 respectively. When an optocoupler provides drive signal to the gate of its respective FET, the FET will be turned on and allow current from the DC voltage source 34 to flow through the FET. Taking FET 111 and optocoupler 140 as a specific example, the optocoupler outputs a drive signal which is coupled to the gate of the FET through resistor 160. Resistor 160 serves to eliminate the likelihood of parasitic oscillations in the FET. The gate is also connected to the source through resistor 161 which provides a discharge path for the high gate capacities and protects the FET against any electrostatic discharges. The remaining FETs and optocouplers are also connected in the same manner.

When FETs 111, 114 are switched on, current flows from the positive side of the full wave rectifier bridge 104, through FET 111, through capacitor 124, across the primary 130*a* of the transformer 130, through FET 114 and to the negative side of the rectifier 104. Conversely, when FETs 112, 113 are switched on, current flows form the positive side of the rectifier 104, through FET 113, across the primary 130*a* of the transformer 130, through the capacitor 124 and to the negative side of the rectifier 104. Thus, the output bridge 28 supplies an alternating current to the transformer 130 at the drive signal frequency, with each pair of the FETs providing one half cycle of the alternating current.

It can be appreciated that the generator according to the invention is not damaged if a short circuit or open circuit is created across the output. The invention eliminates the need for a load coil across the output. Thus, if the load is removed and a short circuit is created across the output, the current through the FETs 111–114 does not increase to a degree which can cause damage to the output bridge 28. Similarly, if an open circuit is created, the voltage across the FETs of the output bridge 28 remains at a safe level.

Capacitor 124 in series with the 130*a* of the transformer 130 serves two primary purposes. First, the capacitor serves to decouple the FETs 111–114 from the DC voltage source 34. Second, and more significant however, the capacitor value is selected to tune the resonant frequency of the transformer 130 to more closely match the resonant frequency of the load. In this manner, the transformer more efficiently delivers power to the load. Along the same line, the capacitors 125, 126 on the output of the transformer 130 adjust the resonant frequency of the load. Thus, by manipulating the values of the capacitors 124–126, one can more accurately match the resonant frequency of the transformer 130 to the load 22.

Referring now to FIG. 2*b*, there is shown the pulse width modulator 24 which utilizes a commercially available pulse width modulator integrated circuit 150. The frequency determining components of the pulse width modulator 150 are capacitor 151 and resistors 152, 153. The values of capacitor 151 and resistor 153 are selected to broadly set the frequency of the drive signal at the desired frequency. Variable resistor 152 is then adjusted to fine tune the drive signal frequency to the exact desired frequency. It can be appreciated, however, that the frequency of the output signal can be any value. For example, for different loads 22, the output frequency can be anywhere between 25 kHz to 120 kHz.

The input signal 151 represents the power level control signal. The power level can be selected by adjusting the resistance of the variable resistor 154. A third input into the pulse width modulator 150 is the output 156 of the voltage controlled oscillator 30. (The operation of the voltage controlled oscillator will be discussed shortly.) The value of the resistor 155 on the output signal 156 determines the modulation bandwidth of the drive signal generated by the pulse width modulator IC 150. In the present embodiment of the invention, the value of resistor 155 is such that the output signal of the pulse width modulator IC 150 is modulated ±2 kHz. It can be appreciated, however, that for a given implementation of the generator according to the invention, the modulation bandwidth can be made larger or smaller by altering the value of the resistor 155. To allows the user to selectably increase or decrease the modulation bandwidth, the resistor 155 can be a variable resistor. The final input into the pulse width modulator IC 150 is the output 220 of the amplifier 44, which represents the actual power delivered to the load 22 as measured by the wattmeter circuit 42.

Based on the values of the resistors 152, 153 and capacitor 151, the pulse width modulator IC 150 outputs a drive signal with a predetermined frequency, for example 40 kHz. The frequency of the drive signal is modulated by the output 156 of the voltage controlled oscillator 30 within a predetermined bandwidth at a user-selectable modulation rate. As the drive signal frequency is modulated through resonant and off-resonant load frequency, the efficiency of the power delivered to the load is affected. The generator is most efficient at delivering power to the load when the transducer is driven at resonant load frequency. As the drive signal frequency is modulated off-resonance, however, efficiency is lowered and the system will have to compensate by delivering more volt amps to achieve the same real power in the transducer. The amount of power delivered to the load is proportional to the duty cycle of the drive signal. To determine the duty cycle of the drive signal, the pulse width modulator compares the power level control signal 151 to the signal 220, which represents the actual power delivered to the load as measured by the wattmeter circuit 42. As illustrated in FIGS. 3*a*–3*c*, the duty cycle of the drive signal is increased as the drive signal frequency is modulated away from resonant load frequency.

The voltage controlled oscillator 30 is based on a commercially available voltage controlled oscillator integrated circuit 180 having a square wave output. The drawings illustrate resistors 181, 182, 185 and capacitors 183, 184 which represent the frequency determining elements of the voltage controlled oscillator IC 180. Once the values of resistors 181, 182, 185 and capacitors 183, 184 have been selected, the user can sweep the output frequency of the VCO between desired values, e.g., anywhere between 300 Hz to 1100 Hz by adjusting the variable resistor 188. The output signal 156 is coupled to the pulse width modulator IC 150 to modulate the drive signal frequency. As mentioned earlier, the resistor 155 determines the modulation bandwidth by varying the amplitude of the VCO output signal 156.

The frequency and duty cycle of the drive signal generated by the pulse width modulator IC 150 is represented by the two signals 146, 148, which are coupled to the FETs 111–114 of the output bridge 28 through the optocouplers 140–143 Line 147 represents ground. When the output on line 146 is at a level to turn on the optocouplers, the output on line 148 is not. In this state, optocouplers 140 and 143 are switched on and drive the gates of FETs 111, 114, while optocouplers 141, 142 are switched off. Conversely, when the output on line 148 is at a level to turn on the optocouplers, the output on line 146 is not. In this state, optocouplers 141, 142 are switched on and drive the gates of FETs 112, 113, while optocouplers 140, 143 are switched off. By providing drive signals to the gates of the FETS, the FETs are alternatively switched on for a period equivalent to the duty cycle of the drive signal and allow current to flow through the primary of the transformer 130 as explained earlier.

In accordance with an important aspect of the invention, the system monitors the actual power delivered to the load 22, produces a signal indicative of the level thereof, compares that signal to a desired power output signal, and controls the power delivered to the load such that the actual power delivered to the load substantially matches the user-selected power level. For purposes of monitoring the actual power delivered to the load, a wattmeter circuit 42 is provided having two sets of inputs, a first set 133 adapted to monitor voltage across the load, and a second set 135 adapted to monitor load current. It is seen that both of the inputs 133, 135 are isolatingly coupled to the output circuit 29, by means such as transformers 132, 134. By transformer coupling the wattmeter and providing appropriate compensating circuitry in the wattmeter, the system is able to dispense with an input power isolation transformer, and as a result capture a substantial increase in operating efficiency.

The primary for coupling transformer 132 is inductor 130*a* and the secondary is inductor 132*a*. The secondary 132*a* of transformer 132 is coupled by means of input lead 133 into an input of the analog multiplier 200. The primary of the transformer 134 is the line 134*a* and the secondary is the toroidal winding 134*b* about the line 134. In this manner, the transformer 134 is coupled in series with the load 22 to measure the load current. The secondary 134*a* is coupled by means of input lead 135 to an input of the analog multiplier 200. An impedance network illustrated schematically at 202 is coupled in the input circuit of the wattmeter to assure the appropriate phase and magnitude of the voltages and currents taken from the output circuit and to assure that the output of the multiplier 200, taken on a line 201, is a true measure of power in the output circuit. Additional biasing elements and the like are associated with the multiplier 200, but will not be described in greater detail, because their use will be familiar to those skilled in the art. Of note, however, is an RC network 204 coupled to the output of the multiplier 200 to provide the multiplier with sufficiently slow response characteristics to match the wattmeter circuit to the frequency response characteristics expected of the ultrasonic generator.

The multiplier output signal 201, passed through the filter network 204, is provided as an input to the inverting input of the operational amplifier 208. The output 209 of the amplifier 208 passes through the RC network 210, which provides further fine tuning of the response characteristics of the signal 209 and further filters extraneous noise, before being inputted into the inverting input of the operational amplifier 212. The output 220 of the operational amplifier 212 is inputted into the pulse width modulator IC 150 as discussed previously. In this preferred embodiment, the output 201 of the analog multiplier 200 is passed through two inverting operational amplifiers 208, 212 before the amplified signal 200 is inputted into the pulse width modulator IC 150. Alternatively, however, one could amplify the output 201 of the analog multiplier 200 by means of a single operational amplifier without inverting the signal.

It will now be appreciated that what has been provided is an improved ultrasonic generator having the capability of reliably cavitating semi-aqueous solutions. The system provides the user the ability to set an output frequency, and also provides the capability of square wave modulating in a relatively wide sweep range about that frequency. The effect is to rapidly switch between the modulation limits at a modulation rate which is also settable. The system is capable of performing square wave modulation while maintaining a substantially constant power output to the load circuit, even though the frequencies at which the ultrasonic transducer is operating can have substantially different phase angles as a result of being nearer or farther from resonance. As has been described in detail above, the individual elements and features of the generator are related to one another to provide these operational characteristics in a simple yet highly efficient manner.

What is claimed is:

1. A generator for driving an ultrasonic transducer coupled to a load including a cleaning container adapted to hold a volume of cleaning liquid for ultrasonic cleaning of parts immersed in the cleaning liquid, the generator comprising:

an output circuit including the ultrasonic transducer for driving the coupled load, the output circuit having a resonant frequency;

an output bridge interposed between an unregulated DC voltage source and the ultrasonic transducer for supplying power at a controllable level from the unregulated DC voltage source to the ultrasonic transducer;

a pulse width modulator for generating a drive signal having a settable frequency and a variable duty cycle, the drive signal being coupled to the output bridge for causing the output bridge to drive the output circuit at said settable frequency and to supply power to the transducer proportional to the duty cycle of the drive signal;

a frequency modulator having a square wave output and coupled to the pulse width modulator for square wave modulating the drive signal frequency within a predetermined modulation bandwidth and at a modulation rate adequate to reliably produce cavitation in the cleaning liquid;

means for comparing a first signal indicative of actual power delivered to the load and a second signal indicative of power to be delivered to the load, and in response thereto adjusting the duty cycle of the drive signal as the frequency of the drive signal is square wave modulated to maintain a substantially constant real power to the output circuit.

2. The generator of claim 1, wherein the cleaning solution is a semi-aqueous cleaning solution, and the bandwidth of the square wave modulation is greater than ±1 kHz.

3. The generator of claim 2, wherein the cleaning solution is a semi-aqueous cleaning solution, and the bandwidth of the square wave modulation is about ±2 kHz or more.

4. The generator of claim 3, wherein the modulation rate of the modulation is sufficiently high to reliably cavitate the semi-aqueous solution, being on the order of 1 kHz.

5. The generator of claim 1, further comprising a user-selectable modulation rate control for selecting the modulation rate of the modulation bandwidth.

6. The generator of claim 1, wherein the frequency modulator is a voltage controlled oscillator.

7. The generator of claim 4, wherein the frequency modulator is a voltage controlled oscillator.

8. The generator of claim 1 wherein the DC voltage source has sufficient capacity to provide adequate headroom for a change in phase angle in the load which can vary by a factor of 2 or more.

9. The generator of claim 1, further comprising a wattmeter circuit for generating the first signal indicative of actual power delivered to the load; and a user-selectable power level control for generating the second signal indicative of power to be delivered to the load.

10. A generator for driving an ultrasonic transducer coupled to a load including a cleaning container adapted to hold a volume of cleaning liquid for ultrasonic cleaning of parts immersed in the cleaning liquid, the generator comprising:

an output circuit including the ultrasonic transducer for driving the coupled load, the output circuit having a resonant frequency;

an output bridge interposed between an unregulated DC voltage source and the ultrasonic transducer for supplying power at a controllable level from the unregulated DC voltage source to the ultrasonic transducer;

a pulse width modulator for generating a drive signal having a settable frequency and a variable duty cycle, the drive signal being coupled to the output bridge for causing the output bridge to drive the output circuit at said frequency and to supply power to the transducer proportional to the duty cycle of the drive signal;

a frequency modulator having a square wave output and coupled to the pulse width modulator for square wave modulating the drive signal frequency within a modulation bandwidth greater than 2 kHz and at a modulation rate of at least 1 kHz;

means for comparing a first signal indicative of actual power delivered to the load and a second signal indicative of power to be delivered to the load, and in response thereto adjusting the duty cycle of the drive signal as the frequency of the drive signal is square wave modulated to maintain a substantially constant real power to the output circuit.

11. The generator of claim 10, wherein the cleaning solution is a semi-aqueous cleaning solution.

12. The generator of claim 10, further comprising a user-selectable modulation rate control for selecting the modulation rate of the modulation bandwidth.

13. The generator of claim 10, further comprising a wattmeter circuit for generating the first signal indicative of actual power delivered to the load; and a user-selectable power level control for generating the second signal indicative of power to be delivered to the load.

14. The generator of claim 10 wherein the DC voltage source has sufficient capacity to provide adequate headroom for a change in phase angle in the load which can vary by a factor of 2 or more.

15. A method for driving an ultrasonic transducer coupled to a load including a cleaning container, the container being adapted to hold a volume of cleaning liquid for ultrasonic cleaning of parts immersed in the liquid and having a resonant frequency, comprising the steps of:

generating a drive signal at a selected frequency capable of driving the transducer at said frequency, controlling the duty cycle of the drive signal with a closed loop controller to control the power delivered to the load;

coupling the drive signal to an output circuit for driving the load;

square wave modulating the drive signal with a sufficiently wide modulation bandwidth and sufficiently high modulation rate to reliably cavitate the cleaning liquid;

measuring the actual power delivered to the load; and varying the duty cycle of the drive signal as the drive signal is modulated to maintain the measured actual power at a substantially constant level.

16. The method of claim 15 further including the step of producing a demand signal related to the actual power to be delivered to the load, comparing the measured actual power to the demand signal, and varying the duty cycle as a function of the magnitude of the comparison result.

17. The method of claim 15, wherein the modulation frequency bandwidth is more than 2 kHz and the modulation rate is selectable to at least 1 kHz or more.

18. The method of claim 15, wherein the modulation frequency bandwidth is more than ±2 kHz and the modulation rate is selectable to at least 1 kHz or more.

19. A generator for driving an ultrasonic transducer coupled to a load including a cleaning container adapted to hold a volume of cleaning liquid for ultrasonic cleaning of parts immersed in the cleaning liquid, the generator comprising:

an output circuit including the ultrasonic transducer for driving the coupled load, the output circuit having a resonant frequency, the output circuit being capable of operating substantially off resonance, and in normal operation having a phase angle which can vary by a factor of two or more;

an output bridge interposed between an unregulated_DC voltage source and the ultrasonic transducer for supplying power at a controllable level from the unregulated_DC voltage source to the ultrasonic transducer, the unregulated DC voltage source having a power factor approaching one and having sufficient capacity to provide adequate headroom for a change in phase in the load which can vary by a factor of two or more;

a pulse width modulator for generating a drive signal having a nominal output frequency and a variable duty cycle, the drive signal being coupled to the output bridge for causing the output bridge to drive the output circuit at said output frequency and to supply power to the transducer proportional to the duty cycle of the drive signal;

a frequency modulator having a modulating output and coupled to the pulse width modulator for modulating the drive signal frequency;

power control means responsive to a first signal indicative of actual power delivered to the load and a second signal indicative of power to be delivered to the load, and in response thereto adjusting the duty cycle of the drive signal as the frequency of the drive signal is modulated and the phase angle is varied to maintain a substantially constant real power to the output circuit.

* * * * *